United States Patent
Cao et al.

(10) Patent No.: US 12,040,244 B2
(45) Date of Patent: Jul. 16, 2024

(54) NITRIDE SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Kai Cao, Suzhou (CN); Lei Zhang, Suzhou (CN); Yifeng Zhu, Suzhou (CN); King Yuen Wong, Suzhou (CN); Chunhua Zhou, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 480 days.

(21) Appl. No.: 17/418,839

(22) PCT Filed: Mar. 5, 2021

(86) PCT No.: PCT/CN2021/079411
§ 371 (c)(1),
(2) Date: Jun. 27, 2021

(87) PCT Pub. No.: WO2022/183512
PCT Pub. Date: Sep. 9, 2022

(65) Prior Publication Data
US 2023/0031259 A1 Feb. 2, 2023

(51) Int. Cl.
*H01L 23/29* (2006.01)
*H01L 23/14* (2006.01)
(52) U.S. Cl.
CPC .......... *H01L 23/291* (2013.01); *H01L 23/147* (2013.01)
(58) Field of Classification Search
CPC . H01L 23/291; H01L 23/147; H01L 23/3107; H01L 23/3185; H01L 25/0657;
(Continued)

(56) References Cited

U.S. PATENT DOCUMENTS 8,766,440 B2 * 7/2014 Kikuchi ................. H01L 24/20
257/659
8,952,501 B2 * 2/2015 Huang .............. H01L 23/49805
257/623
(Continued)

FOREIGN PATENT DOCUMENTS

CN 1691317 A 11/2005
CN 101034693 A 9/2007
(Continued)

OTHER PUBLICATIONS

First Office Action of corresponding China patent application No. 202180004439.X mailed on Nov. 21, 2022.
(Continued)

*Primary Examiner* — Allison Bernstein
(74) *Attorney, Agent, or Firm* — JCIPRNET

(57) ABSTRACT

A nitride semiconductor device includes a semiconductor carrier, a first nitride-based chip, and first conformal connecting structures. The first nitride-based chip is disposed over the semiconductor carrier. The semiconductor carrier has a first planar surface. The first nitride-based chip has a second planar surface, first conductive pads, and first slanted surfaces. The first conductive pads are disposed in the second planar surface. The first slanted surfaces connect the second planar surface to the first planar surface. The first conformal connecting structures are disposed on the first planar surface and the first nitride-based chip. First obtuse angles are formed between the second planar surface and the first slanted surfaces. Each of the first conformal connecting structures covers one of the first slanted surfaces of the first nitride-based chip and one of the first obtuse angles and is electrically connected to the first conductive pads.

20 Claims, 16 Drawing Sheets

(58) Field of Classification Search
CPC ......... H01L 25/50; H01L 24/32; H01L 24/73;
H01L 2224/24245; H01L 2224/32145;
H01L 2224/73267; H01L 24/82; H01L
24/24; H01L 29/0657; H01L 2224/24145;
H01L 2224/82001; H01L 2225/06524;
H01L 2225/06568; H01L 2924/10155;
H01L 2924/10156; H01L 2924/181;
H01L 23/488; H01L 21/50; H01L 21/568;
H01L 23/3121; H01L 29/778
See application file for complete search history.

(56) References Cited

U.S. PATENT DOCUMENTS

| | | |
|---|---|---|
| 2004/0155322 A1 | 8/2004 | Cho et al. |
| 2009/0321954 A1 | 12/2009 | Oh |
| 2011/0316156 A1 | 12/2011 | Pagaila et al. |
| 2013/0175706 A1 | 7/2013 | Choi et al. |
| 2015/0014830 A1 | 1/2015 | Paek et al. |

FOREIGN PATENT DOCUMENTS

| | | |
|---|---|---|
| CN | 101996342 A | 3/2011 |
| CN | 103887274 A | 6/2014 |

OTHER PUBLICATIONS

International Search Report and Written Opinion of the corresponding PCT application No. PCT/CN2021/079411 mailed on Dec. 7, 2021.

\* cited by examiner

NITRIDE SEMICONDUCTOR DEVICE AND METHOD FOR MANUFACTURING THE SAME

FIELD OF THE INVENTION

The present invention generally relates to a semiconductor device. More specifically, the present invention relates to a nitride semiconductor device with conformal connecting structures.

BACKGROUND OF THE INVENTION

In recent years, nitride semiconductor device such as high-electron-mobility transistors (HEMTs) are prevalent in developments in semiconductor technologies and devices such as high power switching and high frequency applications. These devices utilize a heterojunction interface between two materials having different bandgaps, and electrons are accumulated at the interface and form a two-dimensional electron gas (2DEG) region, which satisfies demands of high power/frequency devices. In addition to HEMTs, examples of devices having heterostructures further include heterojunction bipolar transistors (HBT), heterojunction field effect transistor (HFET), and modulation-doped FETs (MODFET).

Since the size and integration of nitride semiconductor devices have progressed enormously, densities of electrical connections on the devices have increased as well. At present, there is a need to improve flexibility, density, resistance and the yield rate of the connection of nitride devices, thereby making them suitable for mass production.

SUMMARY OF THE INVENTION

In accordance with one aspect of the present disclosure, a nitride semiconductor device with a plurality of conformal connecting structures is provided. The semiconductor device includes a semiconductor carrier, a first nitride-based chip, and first conformal connecting structures. The first nitride-based chip is disposed over the semiconductor carrier. The semiconductor carrier has a first planar surface. The first nitride-based chip has a second planar surface, a plurality of first conductive pads, and a plurality of first slanted surfaces. The first conductive pads are disposed in the second planar surface. The first slanted surfaces connect the second planar surface to the first planar surface. The first conformal connecting structures are disposed on the first planar surface and the first nitride-based chip. A plurality of first obtuse angles are formed between the second planar surface and the first slanted surfaces. Each of the first conformal connecting structures covers one of the first slanted surfaces of the first nitride-based chip and one of the first obtuse angles and is electrically connected to the first conductive pads.

In accordance with another aspect of the present disclosure, a nitride semiconductor device with a plurality of first conformal connecting structures and a plurality of second conformal connecting structures located above the first conformal connecting structures is provided. The nitride semiconductor device includes a semiconductor carrier, a first nitride-based chip, the first conformal connecting structures, a second nitride-based chip, and the second conformal connecting structures. The first nitride-based chip is disposed over the semiconductor carrier. The semiconductor carrier has a first planar surface. The first nitride-based chip has a second planar surface and a plurality of first slanted surfaces connecting the second planar surface to the first planar surface. The first conformal connecting structure are disposed on the first planar surface and electrically connected to the first nitride-based chip. The second nitride-based chip is disposed above the first nitride-based chip. The second nitride-based chip has a fourth planar surface and third slanted surfaces connecting the fourth planar surface to the second planar surface or the first slanted surfaces. The second conformal connecting structures are disposed on the first conformal connecting structures and electrically connected to the second nitride-based chip. Each of the first conformal connecting structures covers one of the first slanted surfaces of the first nitride-based chip. Each of the second conformal connecting structures covers one of the second slanted surfaces of the second nitride-based chip.

In accordance with still another aspect of the present disclosure, a method of manufacturing a semiconductor device is provided. The method includes providing a removable substrate; disposing a semiconductor carrier on the removable substrate; disposing a first nitride-based chip on a first planar surface of the semiconductor carrier; disposing a first conductive layer on the first planar surface and the first nitride-based chip; encapsulating the first nitride-based chip on the first planar surface; and removing the removable substrate. The first nitride-based chip has a second planar surface, a plurality of first conductive pads disposed in the second planar surface, and a plurality of first slanted surfaces connecting the second planar surface to the first planar surface. A plurality of first obtuse angles are form between the second planar surface and the first slanted surfaces. The first conductive layer has a plurality of first conformal connecting structures, and each of the first conformal connecting structures covers one of the first slanted surfaces of the first nitride-based chip and one of the first obtuse angles and is electrically connected to the first conductive pads.

By applying such configuration above, the presence of the conformal connecting structures on the nitride-based chip advantageously improves the connection of the semiconductor device. In the semiconductor device, the conformal connecting structures can reduce thickness and length of connection, and the density and flexibility of the connecting circuits can be improved.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
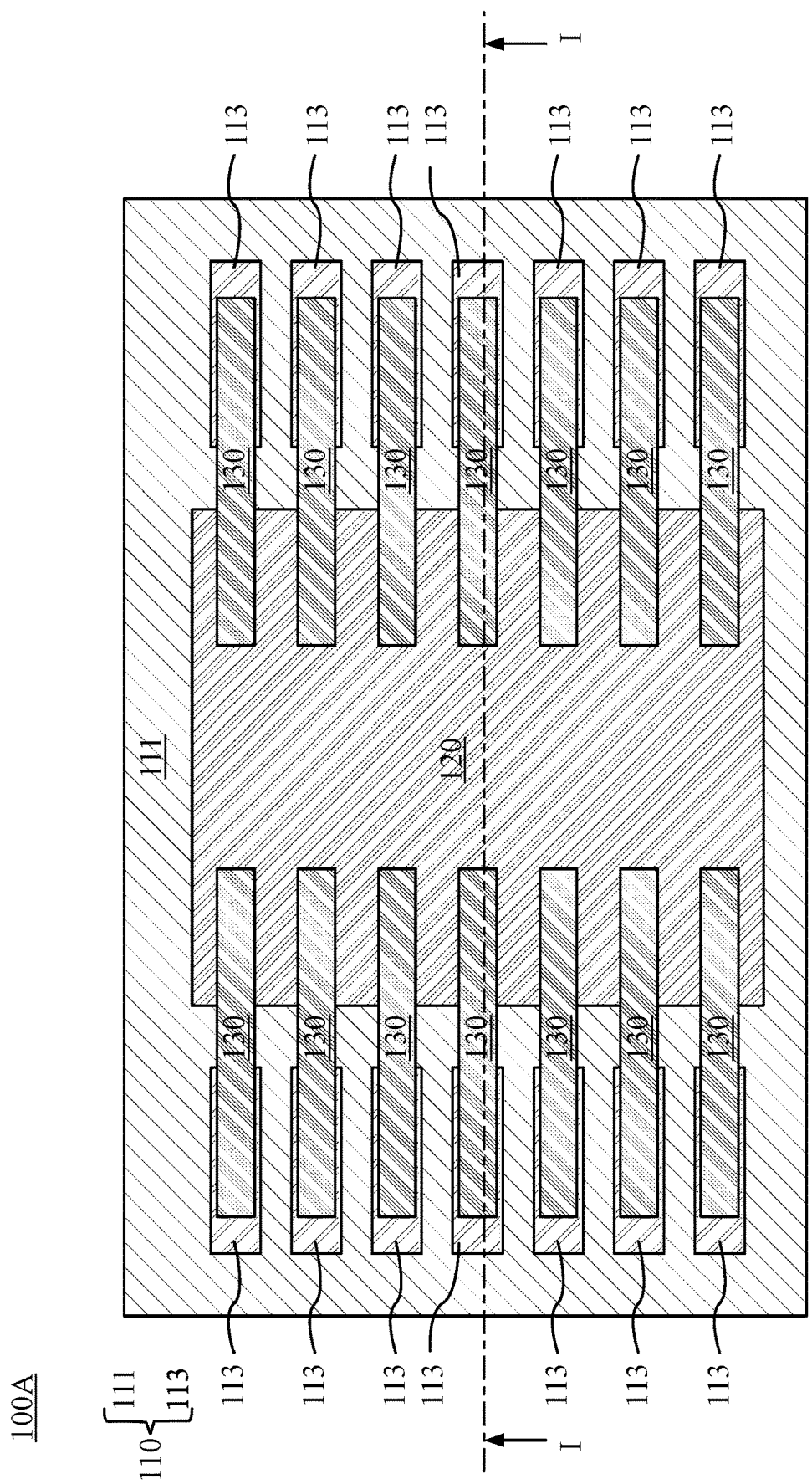
FIG. 1 is a top view of a nitride semiconductor device according to an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above", "below", "up", "left", "right", "down", "top", "bottom", "vertical", "horizontal", "side", "higher", "lower", "upper", "over", "under", and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of present disclosure are not deviated from such arrangement.

In the following description, nitride semiconductor devices, methods for manufacturing the same, and the like are set forth as preferred examples. It will be apparent to those skilled in the art that modifications, including additions or substitutions may be made without departing from the scope and spirit of the disclosure. Specific details may be omitted so as not to disclosure the invention; however, the disclosure is written to enable one skilled in the art to practice the etching herein without under experimentation.

Figure 2A:
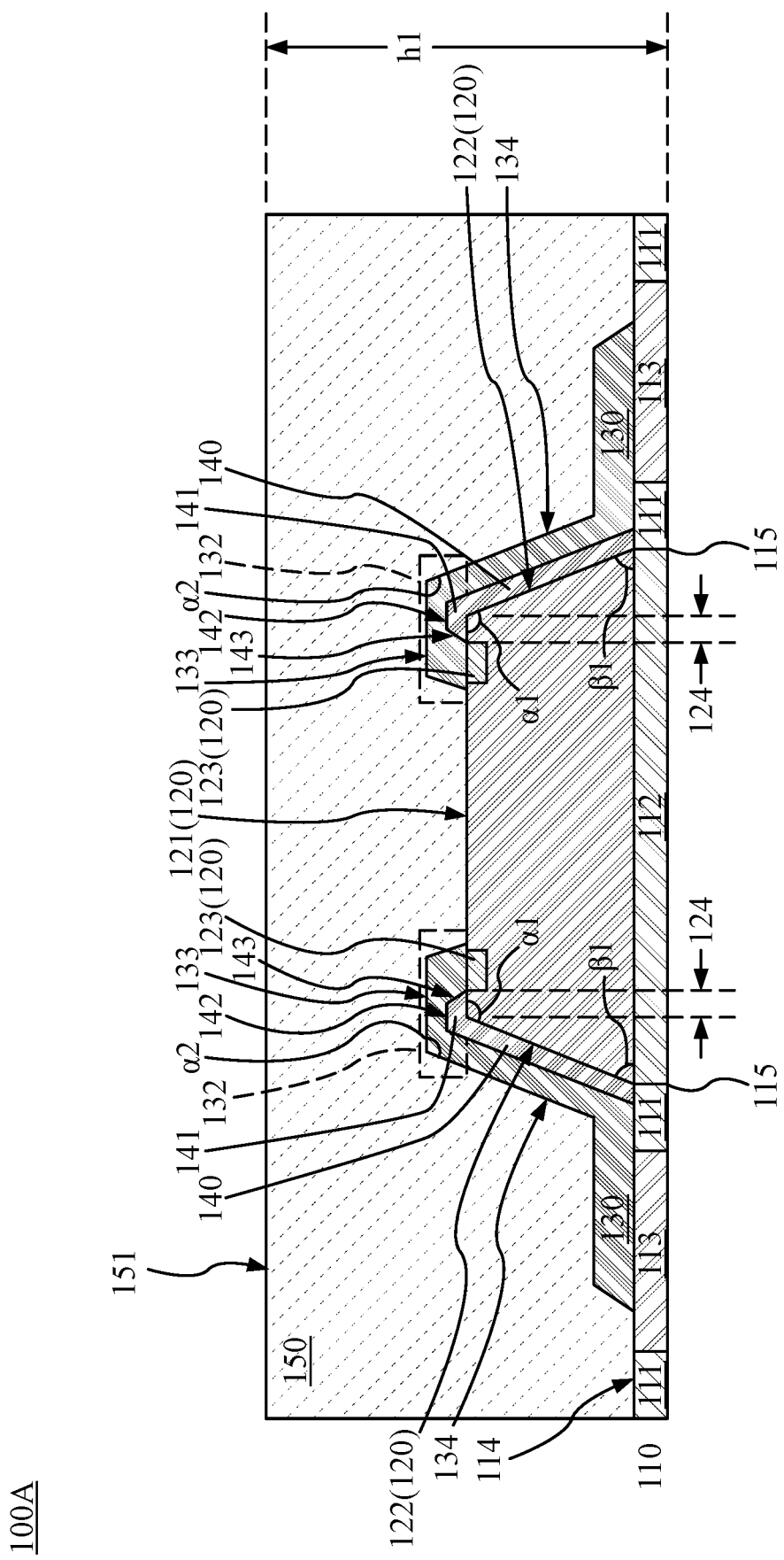
FIG. 2A is a side sectional view of the nitride semiconductor device taken along the cutting plane line I in FIG. 1.

FIG. 1 is a top view of a nitride semiconductor device 100A according to an embodiment of the present disclosure, and FIG. 2A is a side sectional view of the nitride semiconductor device 100A taken along the cutting plane line I in FIG. 1. In this embodiment, the nitride semiconductor device 100A includes a semiconductor carrier 110, a nitride-based chip 120 and a plurality of conformal connecting structures 130.

The nitride-based chip 120 is disposed over the semiconductor carrier 110, and the conformal connecting structures 130 are disposed over the semiconductor carrier 110 and the nitride-based chip 120. To be specific, every said first conformal connecting structure 130 extends over the semiconductor carrier 110 and the nitride-based chip 120, covering the nitride-based chip 120 partly.

It should be understand that said nitride-based chip 120 in this embodiment may include a plurality of semiconductor layers, and the semiconductor layers may include materials such as gallium nitride (GaN), aluminum gallium nitride (AlGaN), silicon, or fluorine ions. However, said materials of the nitride-based chip 120 of the present disclosure is not limited thereto.

The semiconductor carrier 110 has a planar surface 114, and the nitride-based chip 120 and the conformal connecting structures 130 are disposed above the planar surface 114.

The nitride-based chip 120 has slopes for deposition of the conformal connecting structures 130. The nitride-based chip 120 has a planar surface 121, a plurality of conductive pads 123 and a plurality of slanted surfaces 122. The conductive pads 123 are disposed in the planar surface 121.

The slanted surfaces 122 connect the planar surface 121 to the planar surface 114 of the semiconductor carrier 110, and the slopes of the nitride-based chip 120 are formed.

Moreover, a plurality of obtuse angles α1 are formed between the planar surface 121 and the slanted surface 122. In one aspect, every obtuse angle α1 between the planar surface 121 and the slanted surface 122 is more than 90 degree.

Each of the conformal connecting structures 130 covers one of the slanted surfaces 122 and one of the obtuse angles α1 of the nitride-based chip 120, and the conformal connecting structures 130 are electrically connected to the conductive pads 123, respectively. As such, the conformal connecting structures 130 are conformally formed on the planar surface 114, the slanted surfaces 122 and the planar surface 121, and angles of the nitride-based chip 120 near the slanted surfaces 122 are preserved. Therefore, the conformal connecting structures 130 may reduce the thickness h1 of the nitride semiconductor device 100A, and the distribution density of the connection of the nitride-based chip 120 is increased through the conformal connecting structures 130.

Also, the distribution areas of the conformal connecting structures 130 can be designed on the planar surface 121 and the slanted surfaces 122 of the nitride-based chip 120, and layout of the conformal connecting structures 130 on the nitride-based chip 120 is flexible, and the connection of the nitride-based chip 120 can be improved.

In the embodiment, every conformal connecting structure 130 may include one or more conformal and stacked conductive layers. For example, the conductive layers may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. Also, the conformal connecting structures 130 are deposited using a chemical vapor deposition (CVD) process, an atomic layer deposition (ALD) process, a physical vapor deposition (PVD), another applicable process, or a combination thereof.

In one aspect, the shape of the cross-section of the nitride-based chip 120 is a trapezoid, and the legs or lateral sides of the shape are covered by the conformal connecting structures 130. A top planar surface 121 of the shape is partly covered by the conformal connecting structures 130 as well. To be specific, the conformal connecting structures 130 cover the peripheral region 124 of the planar surface 121.

For example, in the embodiment, the shape of cross-section of the nitride-based chip 120 is an isosceles trapezoid. The two later sides, which corresponds to the slanted surfaces 122, are of the same length, and the base angles β1 near the semiconductor carrier 110 are the same, and the obtuse angles α1 above the semiconductor carrier 110 are the same.

The conformal connecting structures 130 form a plurality of conductive ramps or slopes on the nitride-based chip 120, and the conformal connecting structures 130 cover the planar surface 114 near the nitride-based chip 120, and the conformal connecting structures 130 cover the planar surface 121 near the slanted surfaces 122 of the nitride-based chip 120.

Figure 2B:
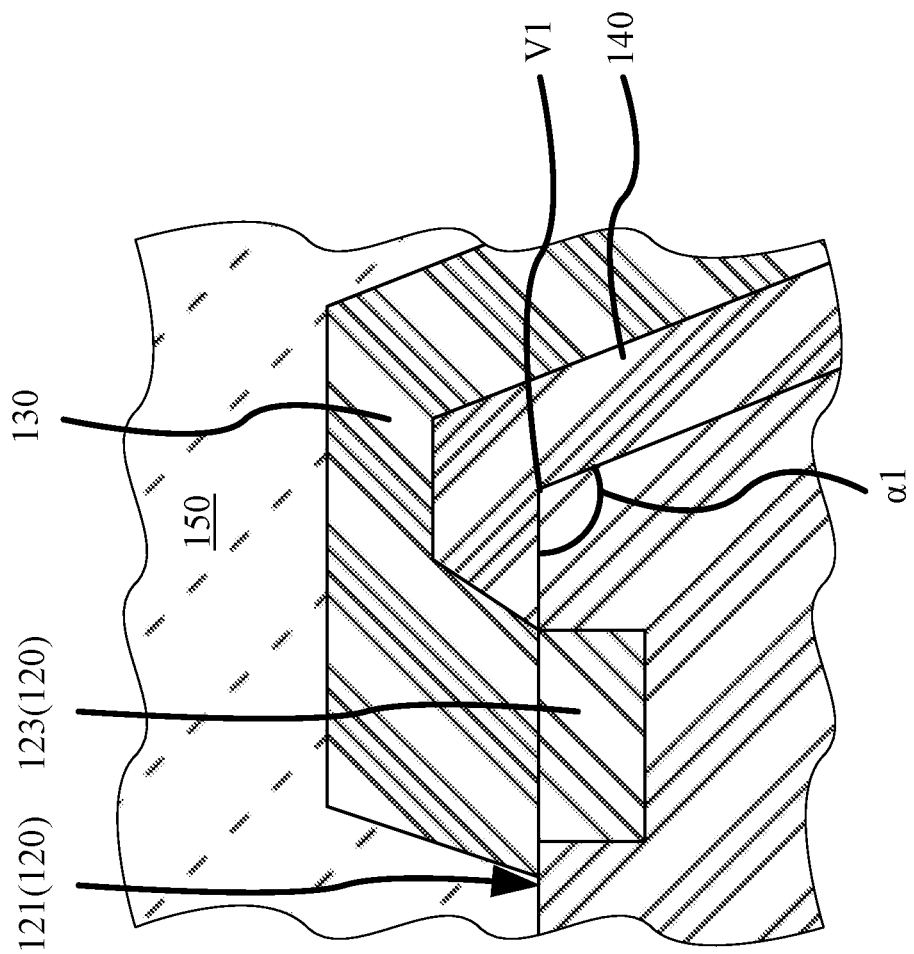
FIG. 2B is an enlarged view of an obtused angle in FIG. 2A.
Figure 2C:
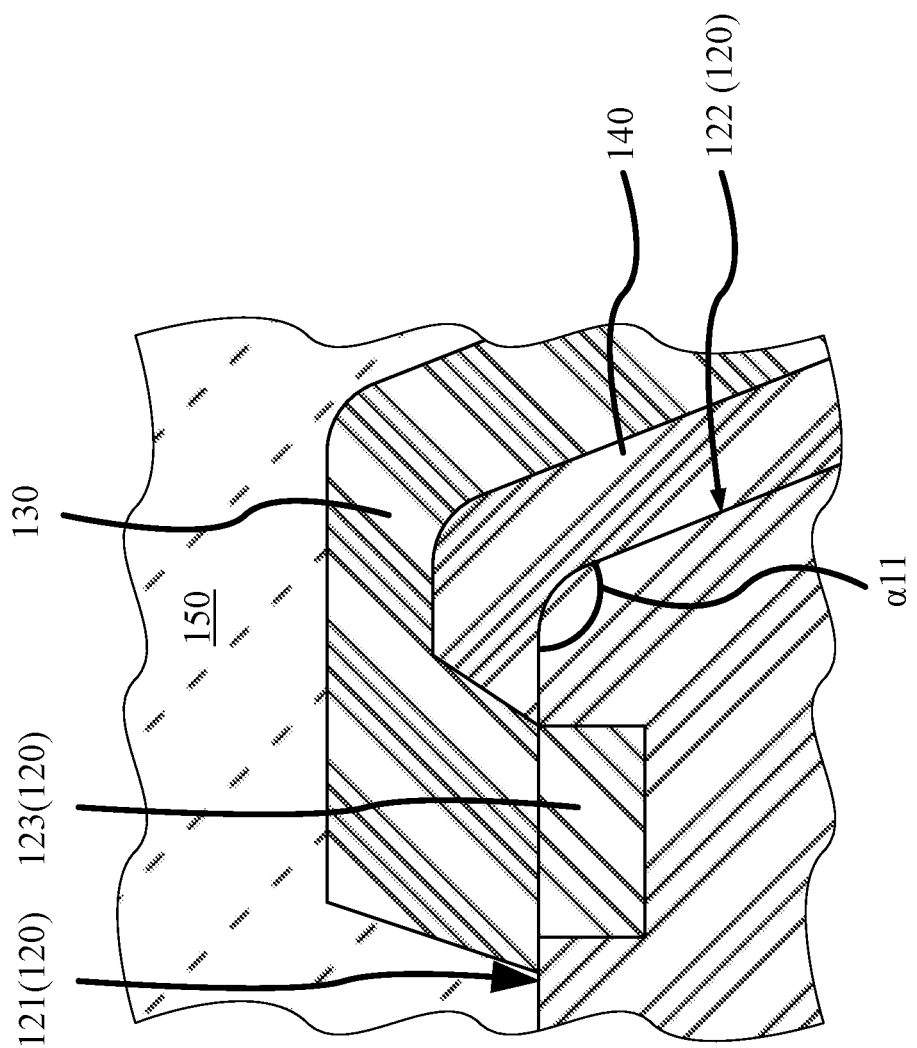
FIGS. 2C to 2E are enlarged views of obtused angles according to other embodiments of the present disclosure.
Figure 2D:
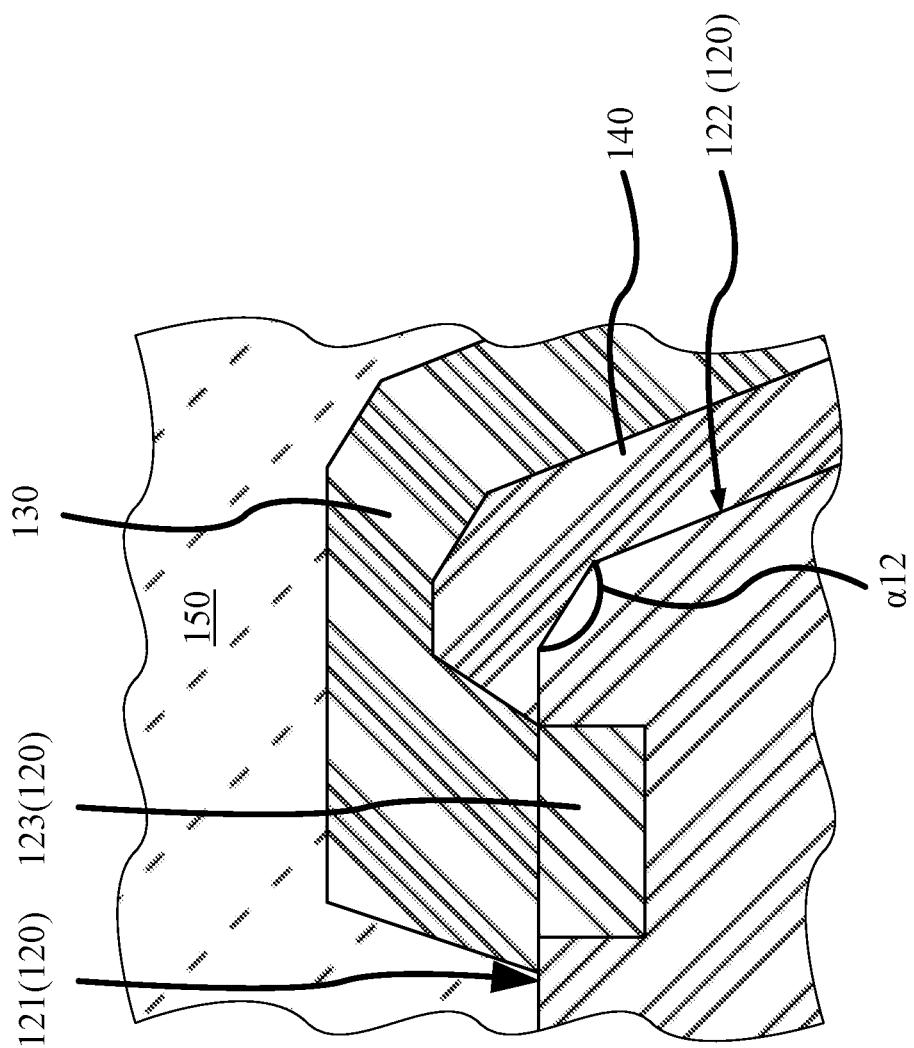
Figure 2E:
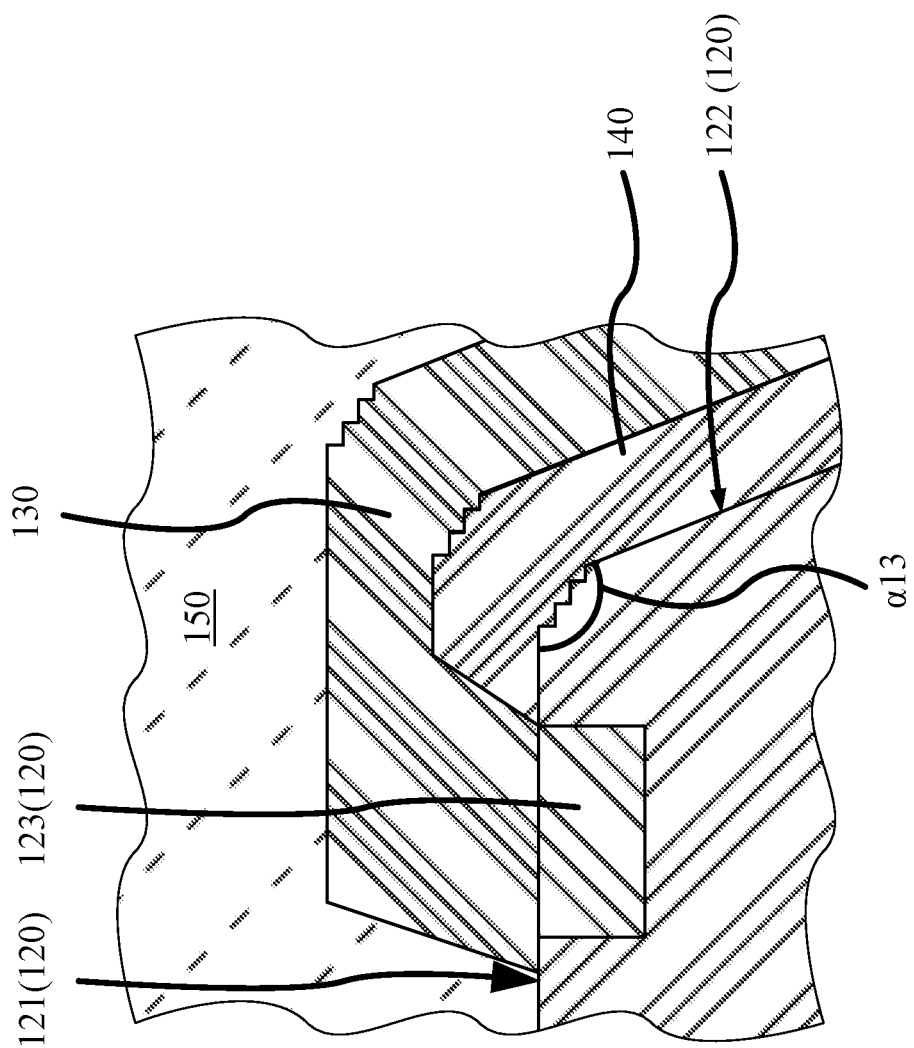

FIG. 2B is an enlarged view of the obtused angle α1 in FIG. 2A, and FIGS. 2C to 2E are enlarged views of obtused angles according to other embodiments of the present disclosure. In this embodiment, the obtuse angles α1 can have an angular vertex V1 as shown in FIG. 2B, but the present disclosure is not limited thereto. In some embodiments of the present disclosure, an obtuse angle α11 is formed between the planar surface 121 and the slanted surface 122 of the nitride-based chip 120, and the obtuse angles α11 between the planar surface 121 and the slanted surface 122 as shown in FIG. 2C can be rounded. In some embodiments of the present disclosure, an obtuse angle α12 is formed between the planar surface 121 and the slanted surface 122 of the nitride-based chip 120, and the obtuse angle α12 as shown in FIG. 2D may have a slanted surface having slope that is less than the slanted surfaces 122. In some embodiment of the present disclosure, an obtuse angle α13 is formed between the planar surface 121 and the slanted surface 122 of the nitride-based chip 120, and the obtuse angle α13 as shown in FIG. 2E may have one or more step structures.

Please refer to FIG. 2A, the nitride semiconductor structure 100A of the embodiment includes insulating layers 140. The insulating layers 140 cover the slanted surfaces 122 of the nitride-based chip 120, and the insulating layers 140 are positioned beneath the conformal connecting structures 130. Each of the insulating layers 140 covers one of the slanted surfaces 122 and one of the obtuse angles α1 and part of the planar surface 121.

In one aspect, parts of the insulating layers 140 are sandwiched between the conformal structures 130 and the nitride-based chip 120, and other parts of the insulating layers 140 are exposed, and, therefore, n other words, the slanted surfaces 122 are insulated by the insulating layers 140, and the connection of the conformal connecting structures 130 are protected.

In this embodiment, the insulating layers 140 may include dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

In one aspect, the conductive pads 123 in the embodiment may include metal or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In this embodiment, the conductive pads 123 are disposed on periphery of the planar surface 121. However, in some embodiments of the present disclosure, the conductive pads 123 may disposed on the central area, periphery, or in a grid pattern, the present disclosure is not limited thereto.

The conductive pads 123 on the planar surface 121 can electrically connect the conformal connecting structures 130, and the conductive pads 123 of the nitride-based chip 120 are not covered by the insulating layers 140. Therefore, connecting areas of the conductive pads 123 can be preserved.

Moreover, the insulating layers 140 of the embodiment form insulating rails 141 on the planar surface 121. The insulating rails 141 are adjacent to the obtuse angles α1. As such, the insulating rails 141 are raised from the planar surface 121. For example, the insulating rails 141 are located on the peripheral region 124 of the planar surface 121.

The insulating rails 141 have slanted surfaces 143 facing towards the middle of the planar surface 121, and the slanted surface 143 is covered by the conformal connecting structure 130, and, therefore, the conformal connecting structure 130 may have another slanted surface facing towards the middle of the second planar surface 121 as well.

Furthermore, the insulating layers 140 each have an insulating top surface 142, and the insulating top surface 142 is located above the planar surface 121. In one aspect, the insulating top surface 142 is planar, and the insulating top surface 142 of the embodiment and the planar surface 121 can be parallel. Also, every insulating top surface 142 connects to the slanted surface 143.

The conformal connecting structures 130 form conductive rails 132 on the planar surface 121, and the conductive rails 132 are disposed above peripheral region 124 of the planar surface 121. The conductive rails 132 cover the insulating rails 141. In other words, the conductive rails 132 are conformally formed on the insulating rails 141, and every conductive rail 132 is electrically connected to the conductive pad 123 located beside the insulating rail 141 underneath.

In the embodiment, each of the conformal connecting structures 130 has a conductive top surface 133 and a conductive slanted surface 134, and an obtuse angle α2 is formed between the conductive top surface 133 and the conductive slanted surface 134, and the obtuse angle α1 is geometrically similar to the obtuse angle α2. The obtuse angle α1 predetermines the obtuse angle α2, and the obtuse angle α1 may ensure the conformal connecting structure 130 is curved in the proper manner, and the connection of the conformal connecting structure 130 can be secured.

In this embodiment, the conductive top surface 133, the insulating top surface 142, the planar surface 121, and the planar surface 114 are parallel, and the conductive slanted surface 134 and the slanted surface 122 are parallel. However, the present disclosure is not limited thereto.

In the embodiment, the semiconductor carrier 110 has a carrier metal layer 112, a plurality of conductive pads 113, and a dielectric layer 111. The carrier metal layer 112 and the conductive pads 113 are separately embedded in the dielectric layer 111.

The nitride-based chip 120 is located on the carrier metal layer 112, and the carrier metal layer 112, the conductive pads 113, and the dielectric layer 111 form the planar surface 114.

The conformal connecting structures 130 cover portions of the conductive pads 113 and the dielectric layer 111 between the carrier metal layer 112 and the conductive pads 113, and the conformal connecting structures 130 are electrically connected to the conductive pads 113 respectively.

In the embodiment, the carrier metal layer 112 and the conductive pads 113 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds.

The slanted surfaces 122 of the nitride-based chip 120 slant outward towards interfaces 115 between the dielectric layer 111 and the carrier metal layer 112. To be specific, the interfaces 115 are formed by the border of the carrier metal layer 112 and the inner sides of the dielectric layer 111 surrounding the carrier metal layer 112. Therefore, the conformal connecting structure 130 on the first slanted surface 122 can extend towards the conductive pads 113.

In the embodiment, the nitride semiconductor device 100A includes a protection layer 150. The protection layer 150 encapsulates the nitride-based chip 120 on the semiconductor carrier 110. The protection layer 150 has a protecting top surface 151, and the conformal connecting structures 130 have conductive top surfaces 133. The protecting top surface 151 and the conductive top surfaces 133 are parallel. In one aspect, the protection layer 150 encapsulates the conformal connecting structures 130 on the nitride-based chip 120 and the semiconductor carrier 110, and the conformal connecting structures 130 cover the slanted surfaces 122 of the nitride-based chip 120 directly, and, therefore; the total thickness h1 of the nitride semiconductor device 100A can be reduced.

FIGS. 3 to 7 are side sectional views of manufacturing method of the nitride semiconductor device 100A of an embodiment of the present disclosure. Please refer to FIG. 3, the manufacturing method of semiconductor device 100A includes providing a removable substrate 101.

In this embodiment, the exemplary materials of the removable substrate 101 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the removable substrate 101 can include, for example but are not limited to, group III elements, group IV elements, group V elements, or combinations thereof (e.g., III-V compounds). In other embodiments, the removable substrate 101 can include, for example but is not limited to, one or more other features, such as a doped region, a buried layer, an epitaxy (epi) layer, or combinations thereof.

Figure 3:
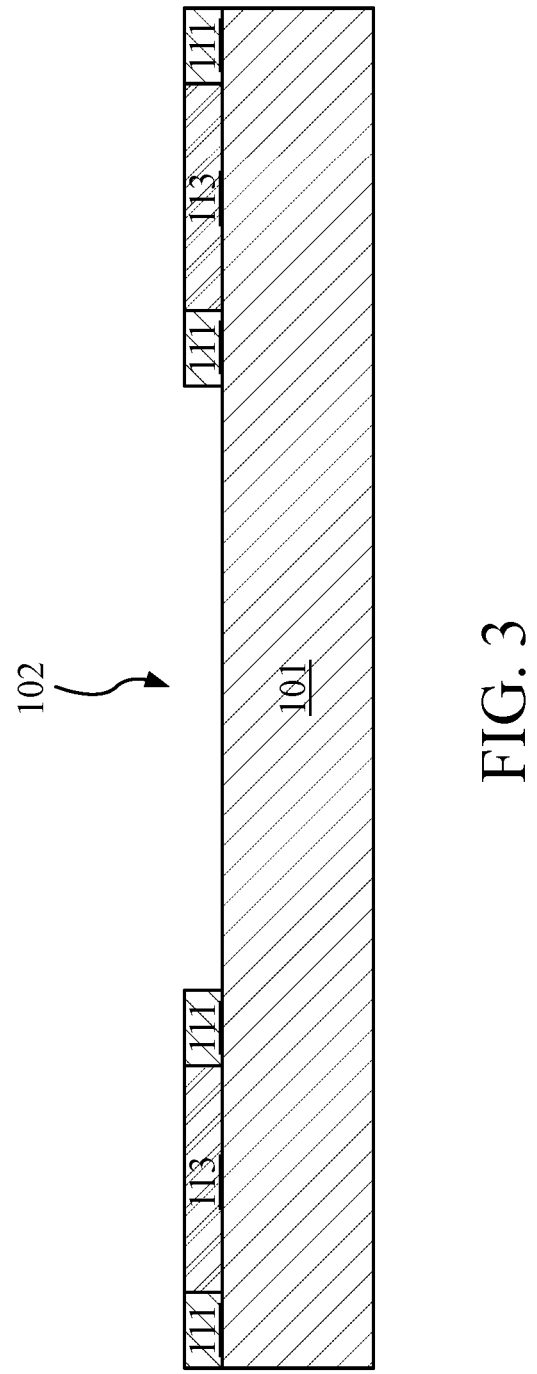
FIGS. 3 to 7 are side sectional views of manufacturing method of nitride semiconductor device of an embodiments of the present disclosure.
Figure 4:
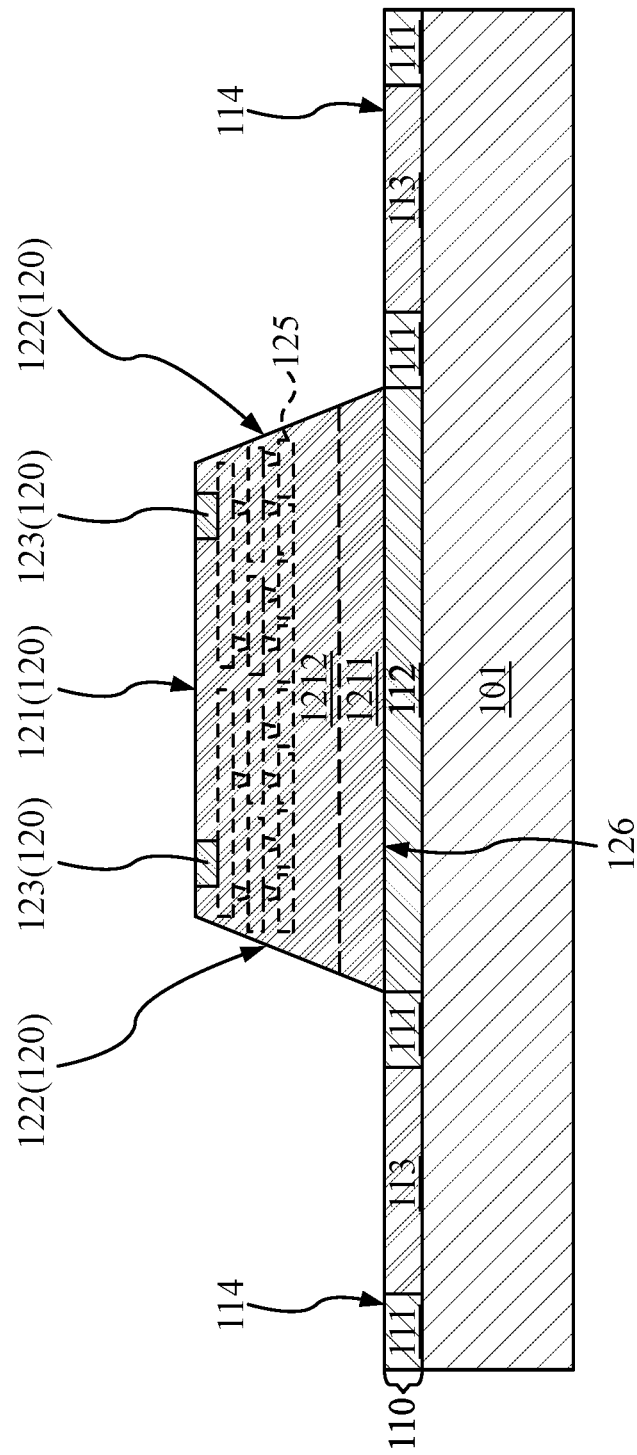

Referring to both FIGS. 3 and 4, a semiconductor carrier 110 is disposed on the removable substrate 101. To be specific, the dielectric layer 111 and the conductive pads 113 are disposed on the removable substrate 101 before the carrier metal layer 112 is disposed, and the conductive pads 113 are embedded in the dielectric layer 111.

Part of the removable substrate 101 is exposed after the deposition of the conductive pads 113 and the dielectric layer 111, which is corresponded to the area of the nitride-based chip 120 that will be described in the following steps. The carrier metal layer 112 is disposed on the exposed area of the removable substrate 101, and the carrier metal layer 112, the dielectric layer 111, and the conductive pads 113 form the semiconductor carrier 110.

In other words, a concave area 102 is formed on the removable substrate 101 after the dielectric layer 111 and the conductive pads 113 are disposed on the removable substrate 101. And the semiconductor carrier 110 is formed by filling the concave area 102 with the carrier metal layer 112, and the semiconductor carrier 110 is disposed on the removable substrate 101.

Please refer to FIG. 4, the nitride-based chip 120 is disposed on the planar surface 114 of the semiconductor carrier 110. To be specific, on the removable substrate 101, vertical projections of the distribution areas of the nitride-based chip 120 and the carrier metal layer 112 overlap. For example, the vertical projections of the distribution areas of the nitride-based chip 120 and the carrier metal layer 112 are the same, but the present disclosure is not limited thereto.

Moreover, the nitride-based chip 120 has a silicon-based substrate 1211 and a plurality of circuits 125. Please refer to FIG. 4, the silicon-based substrate 1211 of this embodiment may have one or more nitride-based semiconductor layers formed thereon. The nitride-based semiconductor layers may include epitaxial layer, undoped layer, buffer layer, GaN-based layer, or AlGaN-based layer. However, the nitride-based semiconductor layers of the nitride-based chip 120 are not limited thereto.

In the embodiment, the circuits 125 and parts of the conductive pads 123 are embedded in the nitride-based semiconductor layers 1212, and a bottom side 126 of the silicon-based substrate 1211 is connected to the carrier metal layer 112. Therefore, the carrier metal layer 112 can provide the nitride-based chip 120 a proper heat dissipation design. Also, the nitride-based semiconductor layers 1212 and the conductive pads 123 can form the planar surface 121.

In the embodiment, the silicon-based substrate 1211 and the nitride-based semiconductor layers 1212 together form the slanted surfaces 122. In one aspect, the silicon-based substrate 1211 and the nitride-based semiconductor layers 1212 form the slanted surface 122 in a continuous manner, and the slope of the slanted surface 122 form by the silicon-based substrate 1211 and the slope of the slanted surface 122 form by the nitride-based semiconductor layer 1212 are the same.

Figure 5:
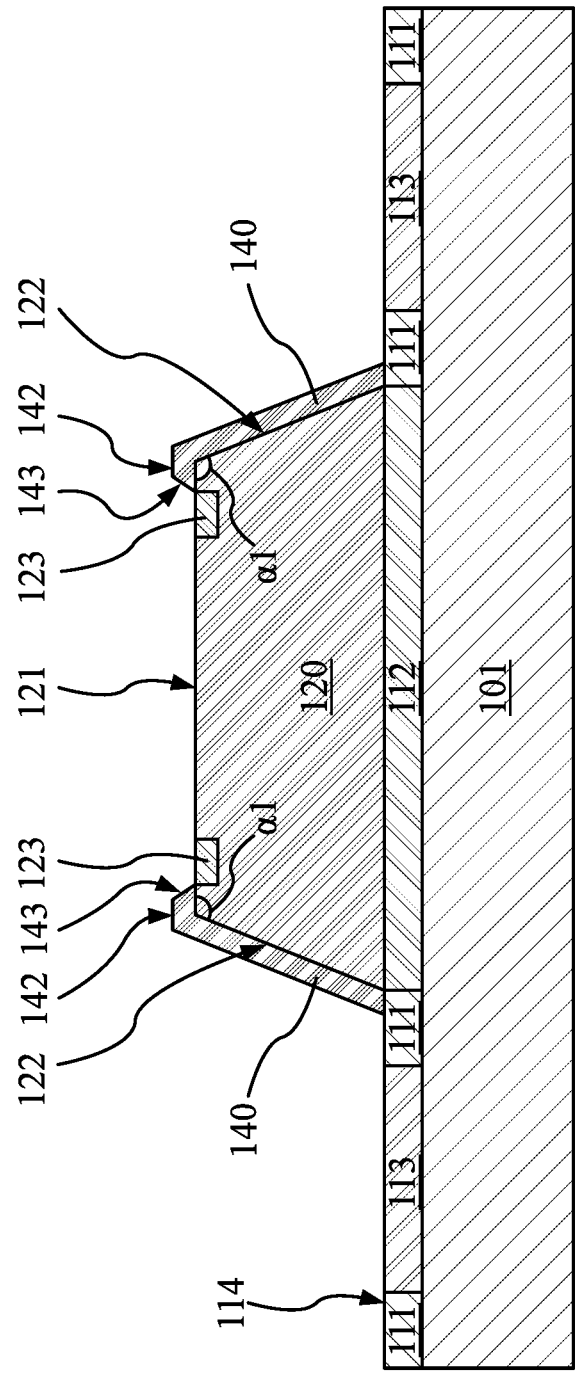
Figure 6:
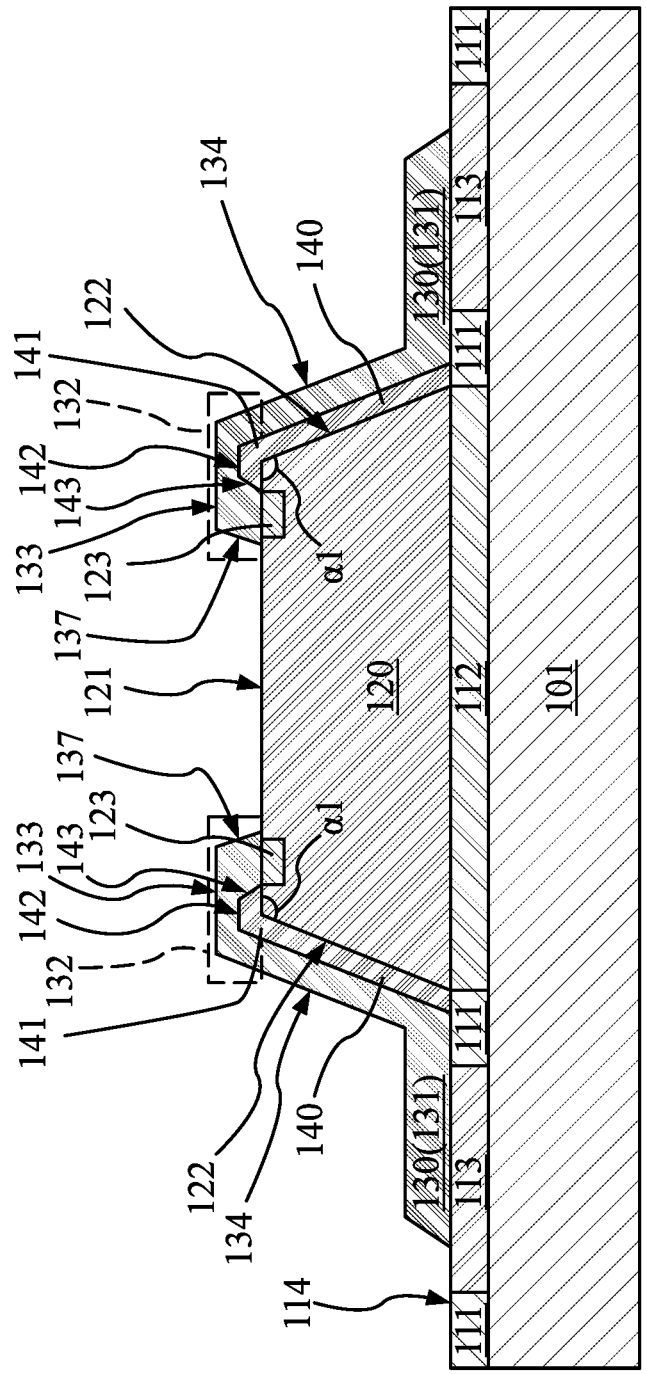

Please refer to FIGS. 5 and 6, the manufacturing method of the embodiment disposes the conductive layer 131 on the planar surface 114 and the nitride-based chip 120. The nitride-based chip 120 has planar surface 121, the conductive pads 123, and the slanted surfaces 122. The conductive pads 123 are disposed in the planar surface 121. The slanted surfaces 122 connect the planar surface 121 to the planar surface 114. The obtuse angles α1 are form between the planar surface 121 and the slanted surfaces 122.

The conductive layer 131 has a plurality of conformal connecting structures 130. The conformal connecting structures 130 covers one of the slanted surfaces 122 of the nitride-based chip 120 and one of the obtuse angles α1 and is electrically connected to the conductive pads 123.

Figure 7:
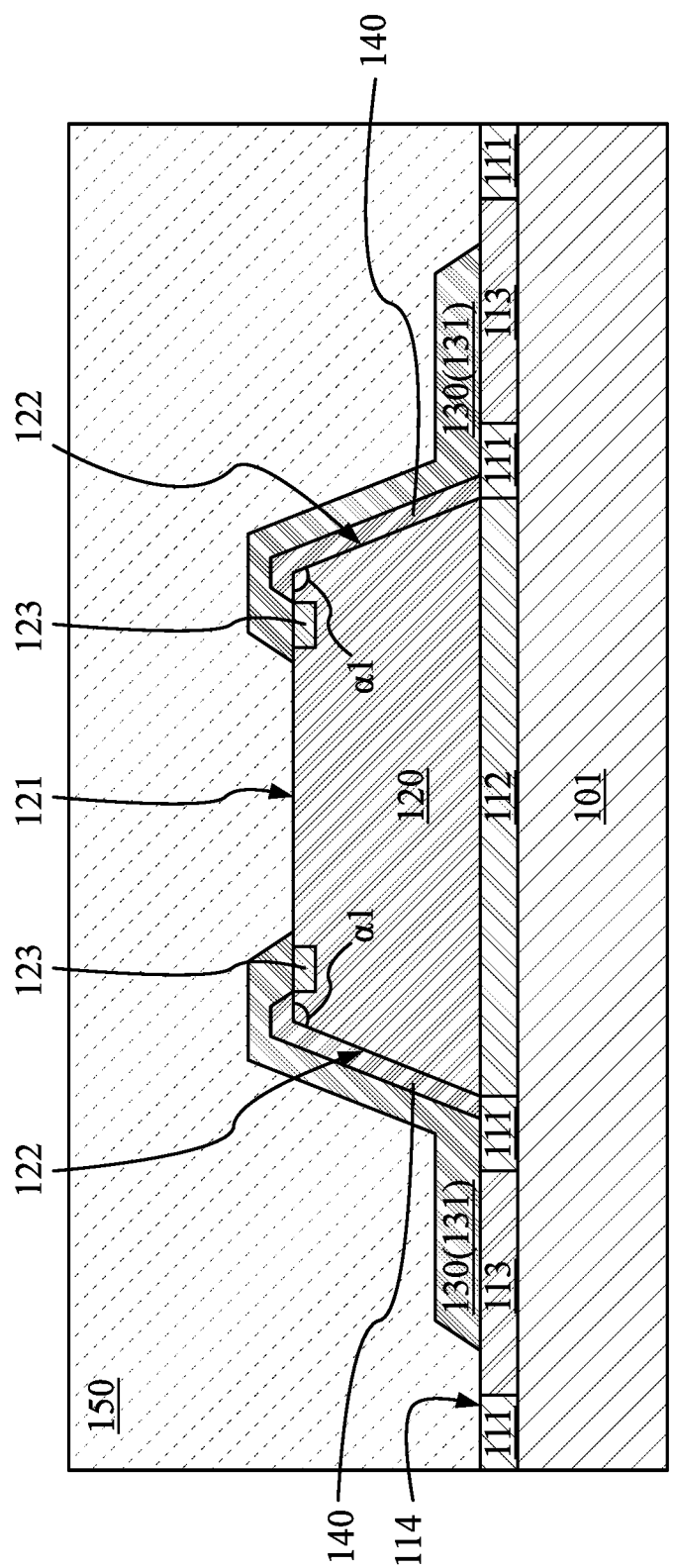

Please refer to FIG. 7, for the manufacturing method of the embodiment encapsulating the nitride-based chip 120 on the planar surface 114 after disposing the conductive layer 131. To be specific, the protection layer 150 encapsulates the nitride-based chip 120 on the planar surface 114, and the protection layer 150 covers the planar surface 114, the conformal connecting structures 130, and the nitride-based chip 120, and areas below the conformal connecting structures 130 are free from the protection layer 150.

In FIG. 2A and FIG. 7, the manufacturing method of the embodiment includes removing the removable substrate 101 after encapsulating the nitride-based chip 120, and the nitride semiconductor device 100A is formed.

In one aspect, the conductive layer 131 and the protection layer 150 are conformally disposed on the nitride-based chip 120, the total thickness h1 of the nitride semiconductor device 100A can be reduced.

Referring to FIG. 5, insulating layers 140 are disposed and cover the slanted surfaces 122 of the nitride-based chip 120 before the conductive layer 131 (in FIG. 6) is disposed, and each of the insulating layers 140 covers one of the slanted surfaces 122 and one of the obtuse angles α1.

Furthermore, the insulating layers 140 may cover the periphery of the planar surface 121, but the present disclosure is not limited thereto. In some embodiments of the present disclosure, the insulating layers 140 may also cover other areas of the planar surface 121 of the nitride-based chip 120.

In this embodiment, on the planar surface 121, edges of the insulating layers 140 coincide with outer edges of the conductive pads 123, and no insulating layers 140 cover the conductive pads 123. However, in other embodiments of the present disclosure, the conformal connecting structures 130 might directly disposed on the nitride-based chip 120 without the disposition of the insulating layers 140.

Please refer to FIGS. 5 and 6, in this embodiment, the insulating layers 140 are conformally formed on the slanted surfaces 122, and the conductive layer 131 is conformally formed on the insulating layers 140, and the insulating layers 140 are positioned beneath the conformal connecting structures 130. Therefore, the insulating layer 140 can insulate the slanted surface 122 from the conformal connecting structures 130, and the conformal connecting structures 130 can connect the conductive pad 123 to the conductive pads 113. Also, since the insulating layers 140 and the conformal connecting structures 130 of the conductive layer 131 are conformally formed, the thickness h1 of the nitride semiconductor device 100A may be reduced.

The insulating layers 140 form insulating rails 141 on the planar surface 121, and the insulating rails 141 are adjacent to the obtuse angles α1. In one aspect, the insulating rails 141 of the insulating layers 140 cover the obtuse angles α1, and the conformal connecting structures 130 cover the insulating rails 141.

In this embodiment, the insulating rails 141 are parts of the insulating layer 140 which are raised from the planar surface 121, and the cross section of every insulating rails 141 is trapezoid, whose bases are parallel to the planar surface 121.

To be specific, the insulating rails 141 of the embodiment are located at peripheral region of the planar surface 121, and the insulating rails 141 are located above the obtuse angles α1. Also, the conductive pads 123 are located beside the insulating rails 141 respectively.

The conformal connecting structures 130 form conductive rails 132 on the planar surface 121, and the conductive rails 132 are disposed above peripheral region of the planar surface 121. However, in some embodiments of the present disclosure, the conductive rails 132 can be formed on other areas of the planar surface 121.

In this embodiment, the conductive rails 132 are parts of the conformal connecting structures 130 which are raised from the planar surface 121. Furthermore, every conformal connecting structure 130 of the embodiment has the conductive top surface 133, the conductive slanted surface 134, and conductive slanted surface 137, and the conductive top surface 133 is planar and connects the conductive slanted surface 134 to the conductive slanted surface 137. The conductive top surface 133 and the planar surface 121 are parallel, and absolute values of the conductive slanted surface 134 and the conductive slanted surface 137 are the same.

Figure 8:
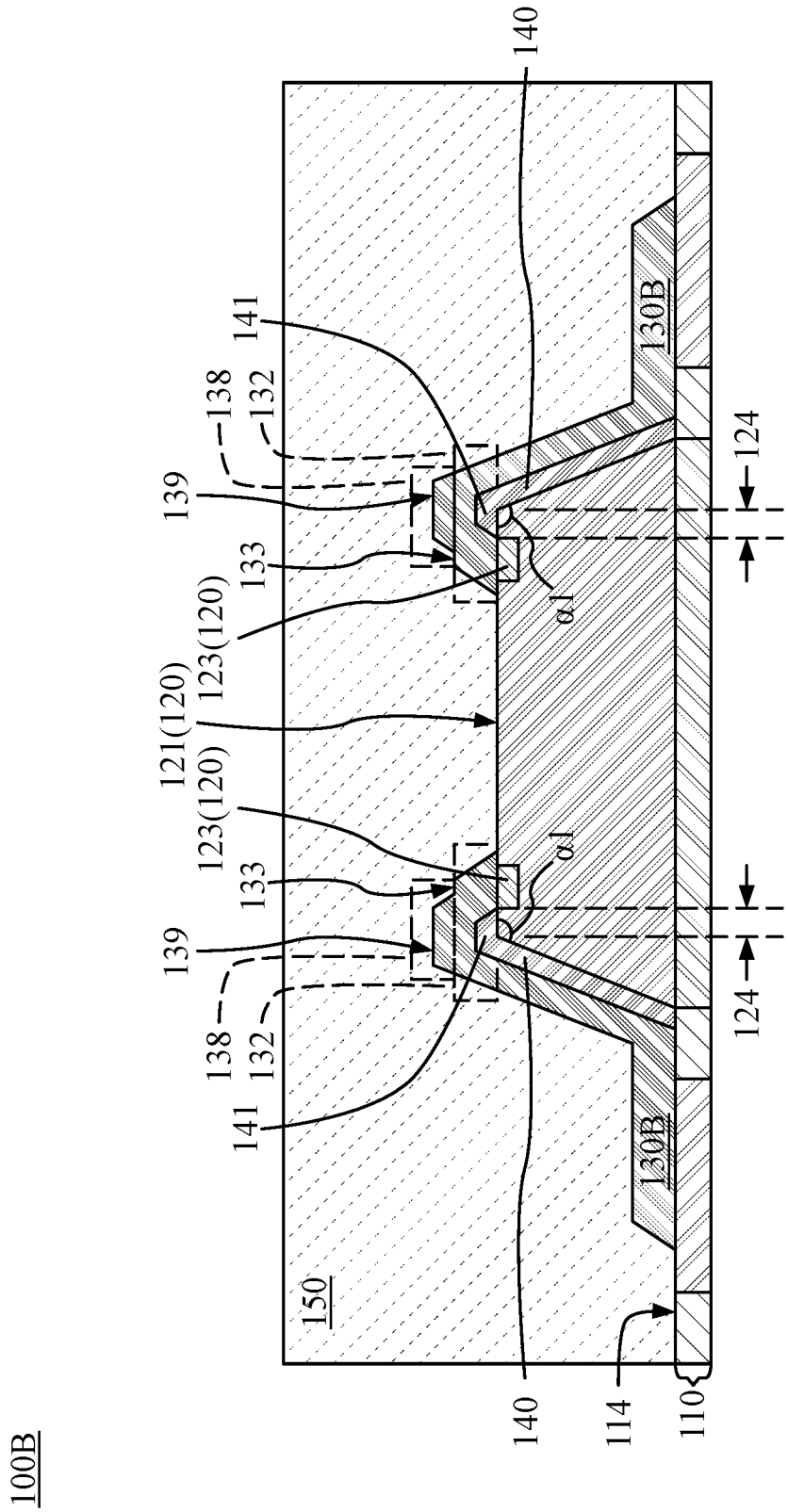
FIG. 8 is a side sectional view of a nitride semiconductor device of another embodiment of the present disclosure.

FIG. 8 is a sectional view of a nitride semiconductor device 100B of another embodiment of the present disclosure. In this embodiment, the nitride semiconductor device 100B is similar to the nitride semiconductor device 100A, and they both have the semiconductor carrier 110, the nitride-based chip 120, the insulating layers 140, and the protection layer 150.

In the embodiment, every conformal connection structure 130B has the conductive rail 132 and a conductive rail 138. The conductive rail 132 is raised from the planar surface 121, and the conductive rail 138 is raised from the conductive top surface 133 of the conductive rail 132. The conductive rail 138 has a conductive top surface 139, and the conductive top surface 139, the conductive top surface 133, and the planar surface 121 are planar and parallel to each others.

The conductive rails 138 are located above the obtuse angles α1, and the conductive rails 138 are located above the insulating rails 141. Furthermore, the conductive rails 138 are located above the peripheral region 124 of the planar surface 121 of the nitride-based chip 120.

The conductive rails 132 can electrically connect the conductive pads 123, and the conductive rails 138 improve the connection above the insulating rails 141, and, therefore, the conformal connecting structures 130B can provide proper connection between the conductive pads 123 and the semiconductor carrier 110.

Figure 9:
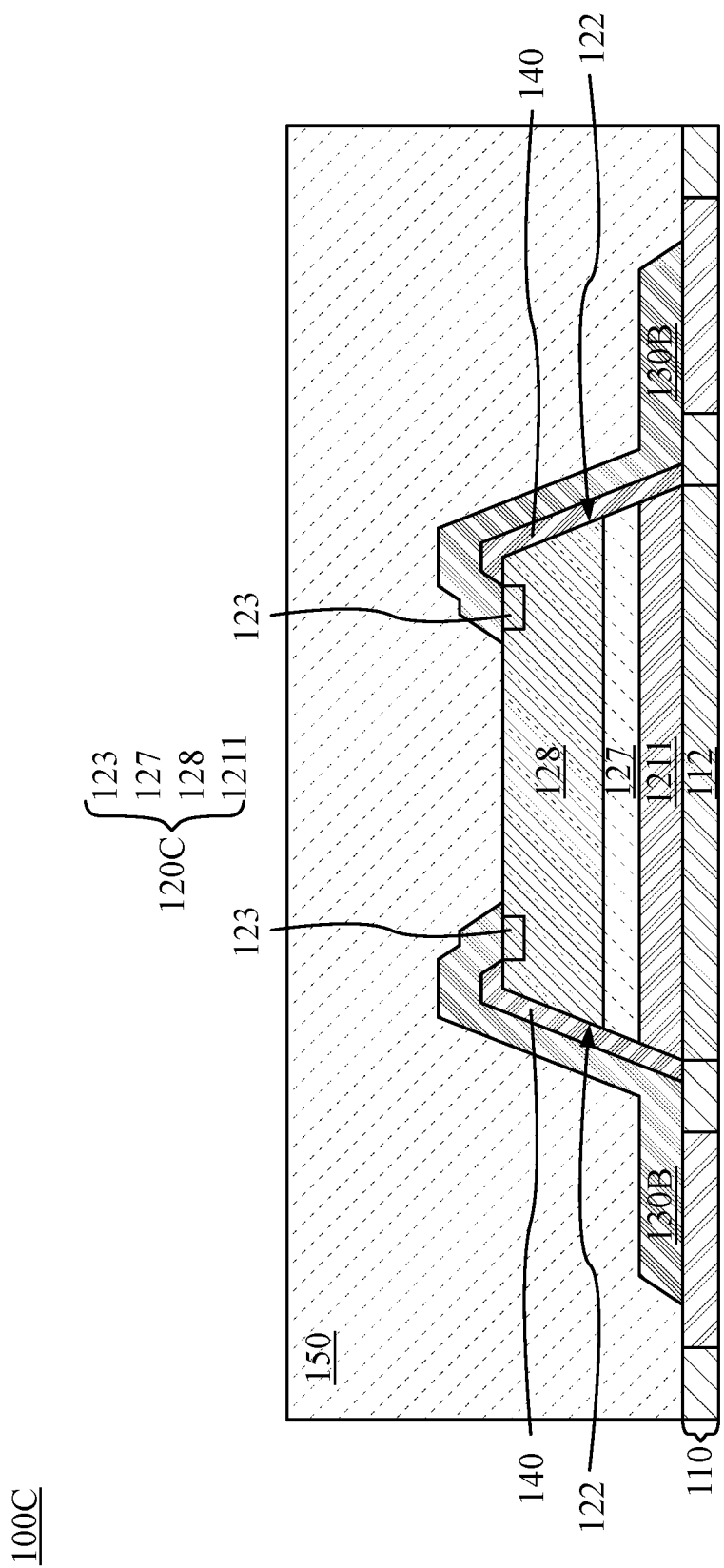
FIG. 9 is a side section view of the nitride semiconductor device of still another embodiment of the present disclosure.

FIG. 9 is a section view of the nitride semiconductor device 100C of still another embodiment of the present disclosure. The nitride semiconductor device 100C is similar to the nitride semiconductor device 100B, and they both have the semiconductor carrier 110, the insulating layers 140, the conformal connecting structures 130B, and the protection layer 150.

In the embodiment, the nitride semiconductor device 100C has nitride-based chip 120C, and the nitride-based chip 120C includes the silicon-based substrate 1211, an epitaxial layer 127, and a circuit layer 128.

The silicon-based substrate 1211 is disposed on the carrier metal layer 112 of the semiconductor carrier 110, and the epitaxial layer 127 is disposed on the silicon-based substrate 1211, and the circuit layer 128 is disposed on the epitaxial layer 127. The first conductive pads 123 are embedded in the circuit layer 128.

In this embodiment, edges of the epitaxial layer 127, the circuit layer 128, and the silicon-based substrate 1211 form the slanted surfaces 122 together, and the edges are covered by the insulating layers 140 and the conformal connecting structures 130B.

Figure 10:
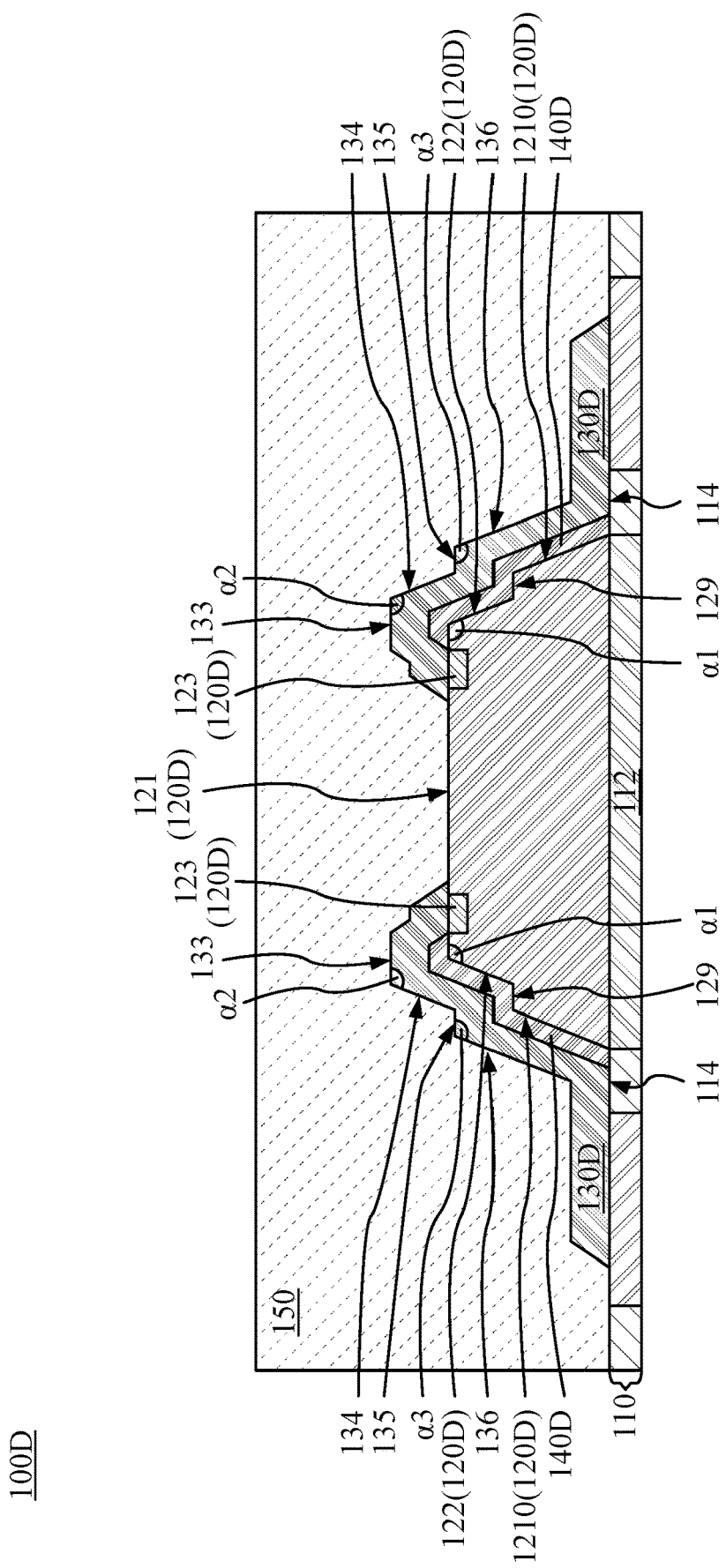
FIG. 10 is a side sectional view of a nitride semiconductor device of yet another embodiment of the present disclosure.

FIG. 10 is sectional view of a nitride semiconductor device 100D of yet another embodiment of the present disclosure. In this embodiment, the nitride semiconductor device 100D includes the semiconductor carrier 110 and the protection layer 150, and the nitride semiconductor device 100D includes nitride-based chip 120D, insulating layers 140D, and conformal connecting structures 130D.

The nitride-based chip 120D includes the planar surface 121, the conductive pads 123, and the slanted surfaces 122, and the nitride-based chip 120D includes planar surfaces 129, and slanted surfaces 1210. The planar surfaces 129 connect the slanted surfaces 122, and the slanted surfaces 1210 connect the planar surfaces 129 to the planar surface 121, and the planar surfaces 129 and the planar surface 121 are parallel. Moreover, the planar surface 114, the planar surface 129, and the planar surface 121 are parallel.

In the embodiment, the slanted surfaces 1210 and the slanted surfaces 122 have the same slope. Therefore, the insulating layers 140D and the conformal connecting structures 130D can be disposed on the slanted surfaces 122, 1210 properly.

Each of the conformal connecting structures 130D has a conductive top surface 133, a conductive slanted surface 134, a conductive planar surface 135, a conductive slanted surface 136. The conductive planar surface 135 connects the conductive slanted surface 134 to the conductive slanted surface 136, and the conductive slanted surface 134 connects the conductive planar surface 135 to the conductive top surface 133. Obtuse angle α2 is formed between the conductive top surface 133 and the conductive slanted surface 134, and an obtuse angle α3 is formed between the conductive planar surface 135 and the conductive slanted surface 136. Moreover, the conductive top surface 133, the conductive planar surface 135, and the planar surface 121 are parallel, and the conductive slanted surface 134 and the conductive slanted surface 135 have the same slope.

Also, the obtuse angle α1, the obtuse angle α2, and the obtuse angle α3 are geometrically similar, and the conformal connecting structure 130D and the insulating layers 140D can conformally formed on the nitride-based chip 120D.

Figure 11:
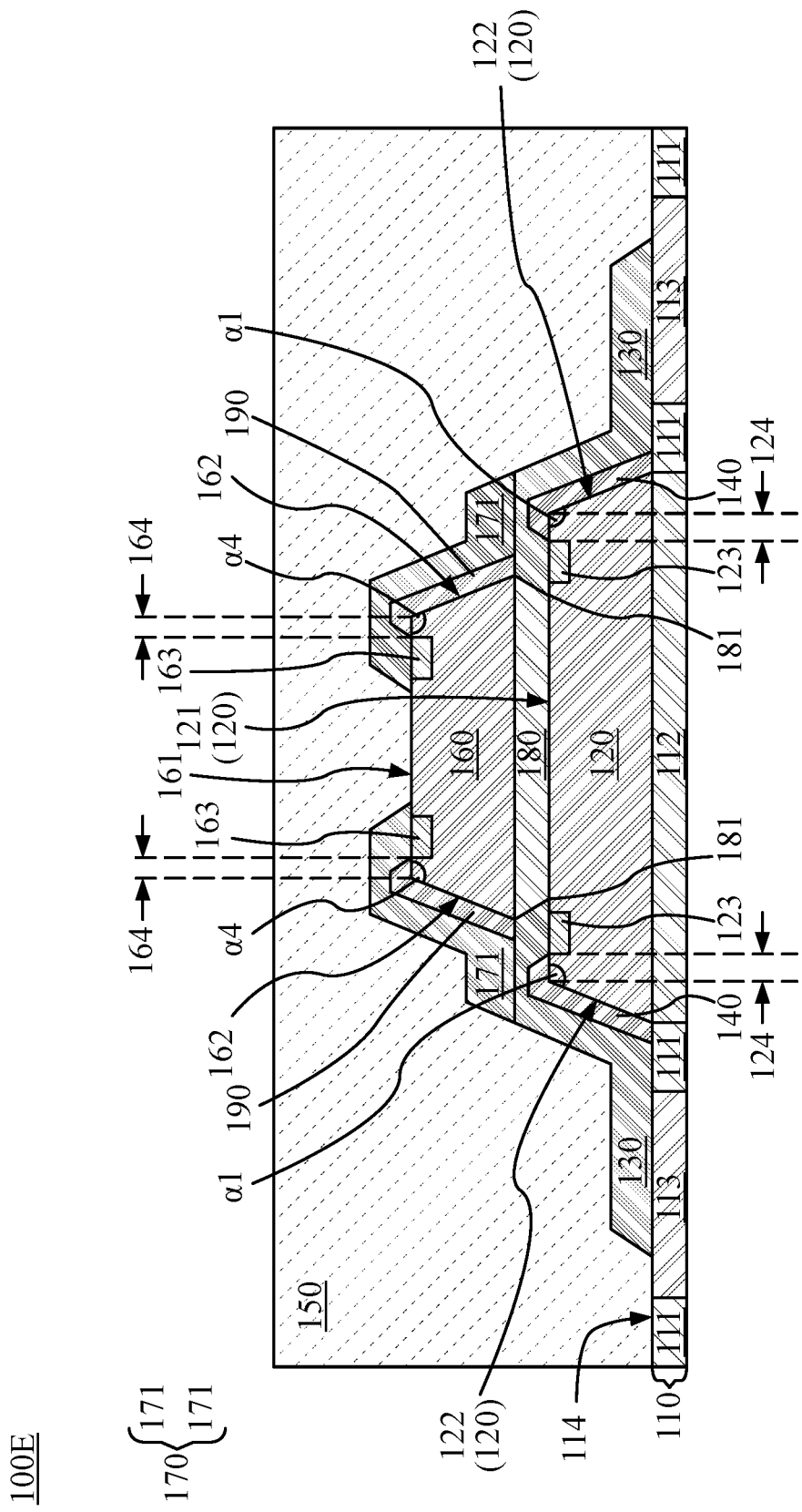
FIG. 11 is a side sectional view of a nitride semiconductor device of another embodiment of the present disclosure.

FIG. 11 is sectional view of a nitride semiconductor device 100E of another embodiment of the present disclosure. In this embodiment, the nitride semiconductor device 100E includes semiconductor carrier 110, nitride-based chip 120, conformal connecting structures 130, nitride-based chip 160, and conductive layer 170. The conductive layer 170 has conformal connecting structures 171.

The semiconductor carrier 110 has a planar surface 114. The nitride-based chip 120 is disposed over the semiconductor carrier 110, and the nitride-based chip 120 has a planar surface 121 and slanted surfaces 122 connecting the planar surface 121 to the planar surface 114. The conformal connecting structures 130 are disposed on the planar surface 114 and electrically connected to the nitride-based chip 120. The nitride-based chip 160 is disposed above the nitride-based chip 120, and the nitride-based chip 160 has a planar surface 161 and slanted surfaces 162 connecting the planar surface 161 to the planar surface 121 or the slanted surfaces 122. The conformal connecting structures 171 are disposed on the conformal connecting structures 130 and electrically connected to the nitride-based chip 160.

Each of the conformal connecting structures 130 covers one of the slanted surfaces 122 of the nitride-based chip 120, and each of the conformal connecting structures 171 covers one of the slanted surfaces 162 of the nitride-based chip 160.

Therefore, the conformal connecting structures 130 are conformally formed on the nitride-based chip 120, and the conformal connecting structures 171 are conformally formed on the nitride-based chip 160, and the conformal connecting structures 130 form electrical connecting between the conformal connecting structures 171 and the semiconductor carrier 110.

In the embodiment, the nitride-based chip 120 has a plurality of conductive pads 123 disposed in the planar surface 121. The nitride-based chip 160 has a plurality of conductive pads 163 disposed in the planar surface 161. The conformal connecting structures 130 covers peripheral region 124 of the planar surface 121 and is electrically connected to the conductive pads 123, and the conformal connecting structures 171 covers peripheral region 164 of the planar surface 161 and is electrically connected to the conductive pads 163.

The planar surface 121 and the slanted surfaces 122 form a plurality of obtuse angles α1, and the planar surface 161 and the slanted surfaces 162 form a plurality of obtuse angles α4. The conformal connecting structures 130 cover the obtuse angle α1, and the conformal connecting structures 171 cover the obtuse angles α4, and the obtuse angles α1 and the obtuse angles α4 are geometrically similar.

The nitride semiconductor device 100E comprising a dielectric carrier 180 disposed on the planar surface 121 of the nitride-based chip 120, and the nitride-based chip 160 is disposed on the dielectric carrier 180. The dielectric carrier 180 is located within the conformal connecting structures 130, and a projection of the nitride-based chip 160 on the dielectric carrier 180 is located between interfaces 181 between the dielectric carrier 180 and the conformal connecting structures 130. To be specific, the interfaces 181 are tilted.

The nitride semiconductor device 100E further comprising insulating layers 140 covering the slanted surfaces 122 of the nitride-based chip 120 and second insulating layer 171 covering the slanted surface 162 of the nitride-based chip 160. Each of the insulating layers 140 covers one of the slanted surfaces 122 and one of the obtuse angles α1 and peripheral region 124 of the planar surface 121 and is positioned beneath the conformal connecting structures 130. Each of the insulating layers 190 covers one of the slanted surfaces 162 and one of the obtuse angles α4 and peripheral region 164 of the planar surface 161 and is positioned beneath the conformal connecting structures 171.

Figure 12:
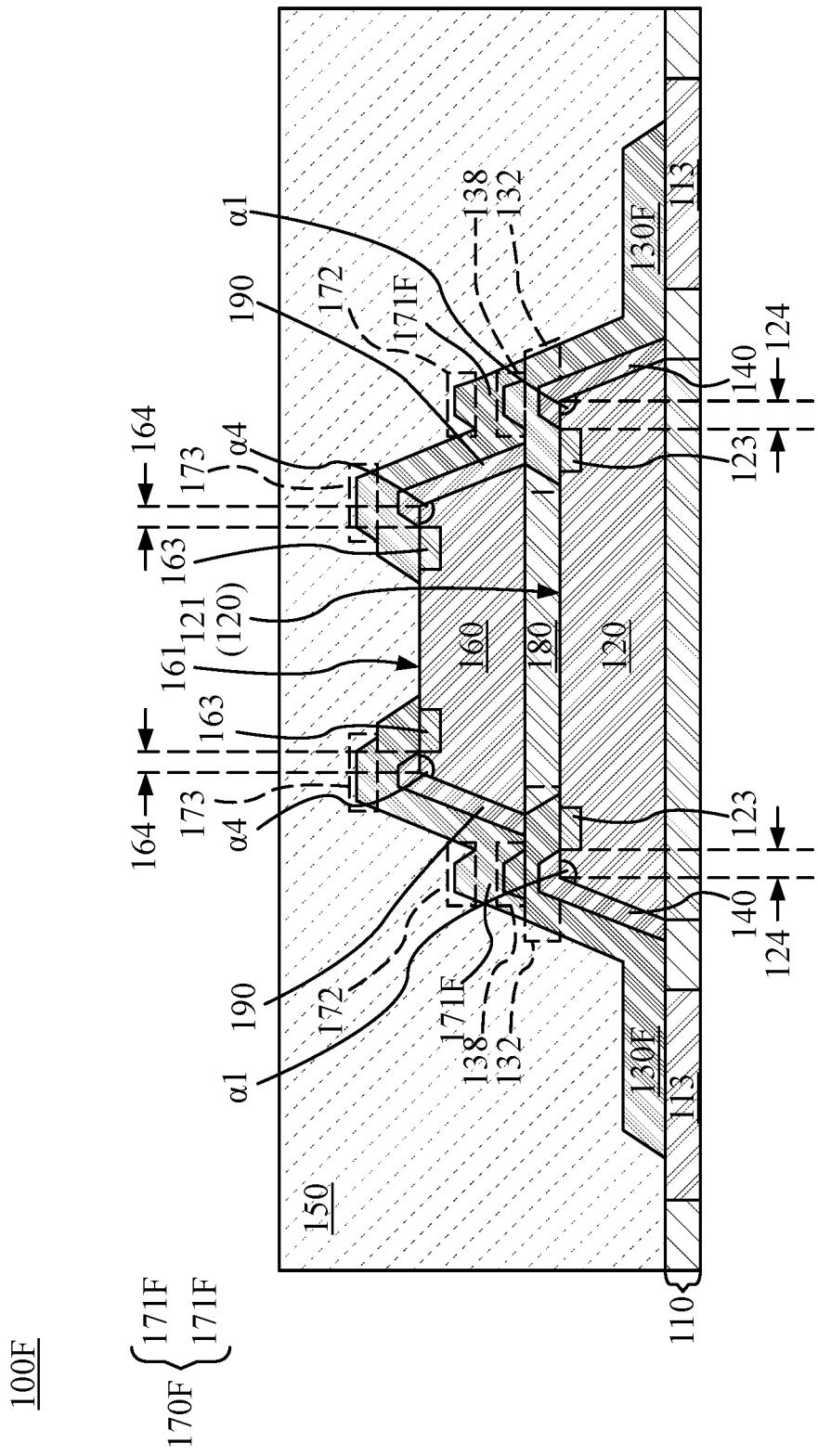
FIG. 12 is a side sectional view of nitride semiconductor device of yet another embodiment of the present disclosure.

FIG. 12 is a sectional view of nitride semiconductor device 100F of yet another embodiment of the present disclosure. In this embodiment, the nitride semiconductor device 100F is similar to the nitride semiconductor device 100E, which both include the semiconductor carrier 110, the nitride-based chip 120, the dielectric carrier 180, the nitride-based chip 160, and the protection layer 150.

The nitride semiconductor device 100F includes a conductive layer 170F and conformal connecting structures 130F, and the conductive layer 170F has conformal connecting structures 171F. In this embodiment, every conformal connecting structure 130F has conductive rail 132 and conductive rail 138 located above the peripheral region 124 of the planar surface 121, and the conductive rail 138 is raised from the conductive rail 132, and the conductive rail 132 is raised from the planar surface 121.

Every conformal connecting structure 171F has conductive rail 172 and conductive rail 173. The conformal connecting structure 171F covers the conductive rail 172, and the conductive rail 172 is disposed above the conductive rail 138. The conductive rail 173 is disposed above the peripheral region 164 of the planar surface 161, and the conductive rail 173 is located above the obtuse angle α4 and the top part of the insulating layer 190. Therefore, connections between the conductive pads 163, the conductive pads 123, and the conductive pads are improved by the conformal conductive structures 171F, 130F.

Although not shown in the drawings, it is understood that additional nitride-based chips may be integrated on a single semiconductor carrier in the manner described for the devices above such that an arbitrary number of nitride semiconductor devices may be integrated in this manner. Furthermore, the above embodiments provide different configurations of the nitride semiconductor devices, which will be advantageous to improve the flexibility. For example, the different configurations of the nitride semiconductor devices can be selected according to process conditions, device sizes, device functions (e.g., low voltage, high voltage, or radio frequency application), or likes. Although not shown in the drawings, it is understood that above different configurations of the nitride semiconductor devices can be integrated into a single chip or a circuit.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride semiconductor device, comprising:
    a semiconductor carrier having a first planar surface;
    a first nitride-based chip disposed over the semiconductor carrier, wherein the first nitride-based chip has:
        a second planar surface;
        a plurality of first conductive pads disposed in the second planar surface; and
        a plurality of first slanted surfaces connecting the second planar surface to the first planar surface; and
    a plurality of first conformal connecting structures disposed on the first planar surface and the first nitride-based chip,
    wherein a plurality of first obtuse angles are formed between the second planar surface and the first slanted surfaces, and each of the first conformal connecting structures covers one of the first slanted surfaces of the first nitride-based chip and one of the first obtuse angles and is electrically connected to the first conductive pads.

2. The nitride semiconductor device of claim 1, further comprising one or more first insulating layers covering the first slanted surfaces of the first nitride-based chip and positioned beneath the first conformal connecting structures, wherein each of the first insulating layers covers one of the first slanted surfaces and one of the first obtuse angles and part of the second planar surface.

3. The nitride semiconductor device of claim 2, wherein the first conductive pads of the first nitride-based chip are not covered by the first insulating layers.

4. The nitride semiconductor device of claim 2, wherein the first insulating layers form insulating rails on the second planar surface, and the insulating rails are adjacent to the first obtuse angles and located on the second planar surface, and the first conformal connecting structures cover the insulating rails.

5. The nitride semiconductor device of claim 2, wherein the first insulating layers each have a first insulating top surface, and the first insulating top surface is located above the second planar surface.

6. The nitride semiconductor device of claim 1, wherein each of the first conformal connecting structures has a first conductive top surface and a first conductive slanted surface, and a second obtuse angle is formed between the first conductive top surface and the first conductive slanted surface, and the first obtuse angle is geometrically similar to the second obtuse angle.

7. The nitride semiconductor device of claim 1, wherein the semiconductor carrier has a carrier metal layer, a plurality of second conductive pads, and a first dielectric layer, and the carrier metal layer and the second conductive pads are separately embedded in the first dielectric layer, and the first nitride-based chip is located on the carrier metal layer, and the carrier metal layer, the second conductive pads, and the first dielectric layer form the first planar surface, and the first conformal connecting structures cover the first dielectric layer between the carrier metal layer and the second conductive pads and portions of the second conductive pads, and the first conformal connecting structures are electrically connected to the second conductive pads respectively.

8. The nitride semiconductor device of claim 7, wherein the first slanted surfaces slant outward towards interfaces between the first dielectric layer and the carrier metal layer.

9. The nitride semiconductor device of claim 1, further comprising a protection layer, wherein the protection layer encapsulates the first nitride-based chip on the semiconductor carrier, and the protection layer has a protecting top surface, and the first conformal connecting structures have first conductive top surfaces, and the protecting top surface and the first conductive top surfaces are parallel.

10. The nitride semiconductor device of claim 1, wherein the first nitride-based chip has:
    a silicon-based substrate having one or more nitride-based semiconductor layers formed thereon; and
    a plurality of circuits,
    wherein the circuits and parts of the first conductive pads are embedded in the one or more nitride-based semiconductor layers, and a bottom side of the silicon-based substrate is connected to the semiconductor carrier.

11. The nitride semiconductor device of claim 1, wherein the first nitride-based chip has:
    a silicon-based substrate;
    an epitaxial layer disposed on the silicon-based substrate; and
    a circuit layer disposed on the epitaxial layer,
    wherein the first conductive pads are embedded in the circuit layer.

12. The nitride semiconductor device of claim 1, wherein the first nitride-based chip has:
    a plurality of third planar surfaces connecting the first slanted surfaces; and a plurality of second slanted surfaces connecting the third planar surfaces to the first planar surface,
and the third planar surfaces and the second planar surface are parallel.

13. The nitride semiconductor device of claim 12, wherein the first slanted surfaces and the second slanted surfaces have the same slope.

14. The nitride semiconductor device of claim 12, wherein each of the first conformal connecting structures has a first conductive top surface, a first conductive slanted surface, a conductive planar surface, a second conductive slanted surface, and the conductive planar surface connects the first conductive slanted surface to the second conductive slanted surface, and the first conductive slanted surface connects the conductive planar surface to the first conductive top surface, and a plurality of second obtuse angle is formed between the first conductive top surface and the first conductive slanted surface, and a third obtuse angle is formed between the conductive planar surface and the second conductive slanted surface.

15. The nitride semiconductor device of claim 14, wherein the first, the second, and the third obtuse angles are geometrically similar.

16. A manufacturing method of semiconductor device, comprising:
providing a removable substrate;
disposing a semiconductor carrier on the removable substrate;
disposing a first nitride-based chip on a first planar surface of the semiconductor carrier;
disposing a first conductive layer on the first planar surface and the first nitride-based chip;
encapsulating the first nitride-based chip on the first planar surface; and
removing the removable substrate,
wherein the first nitride-based chip has a second planar surface, a plurality of first conductive pads disposed in the second planar surface, and a plurality of first slanted surfaces connecting the second planar surface to the first planar surface, and a plurality of first obtuse angles are form between the second planar surface and the first slanted surfaces, and the first conductive layer has a plurality of first conformal connecting structures, and each of the first conformal connecting structures covers one of the first slanted surfaces of the first nitride-based chip and one of the first obtuse angles and is electrically connected to the first conductive pads.

17. The manufacture method of claim 16, wherein one or more first insulating layers are disposed and cover the first slanted surfaces of the first nitride-based chip before the first conductive layer is disposed, and each of the first insulating layers covers one of the first slanted surfaces and one of the first obtuse.

18. The manufacture method of claim 17, wherein the first insulating layers are conformally formed on the first slanted surfaces, and the first conductive layer is conformally formed on the first insulating layers, and the first insulating layers are positioned beneath the first conformal connecting structures.

19. The manufacture method of claim 17, wherein the first insulating layers form insulating rails on the second planar surface, and the insulating rails are adjacent to the first obtuse angles, and the first conformal connecting structures cover the insulating rails.

20. The manufacture method of claim 16, wherein the first conformal connecting structures form conductive rails on the second planar surface.

* * * * *